United States Patent [19]

Wheatley, Jr.

[11] 4,429,284
[45] Jan. 31, 1984

[54] OPERATIONAL AMPLIFIER

[75] Inventor: Carl F. Wheatley, Jr., Drums, Pa.

[73] Assignee: RCA Corporation, New York, N.Y.

[21] Appl. No.: 324,059

[22] Filed: Nov. 23, 1981

[51] Int. Cl.³ .............................................. H03F 3/45
[52] U.S. Cl. ................................... 330/261; 330/257
[58] Field of Search ............... 330/253, 256, 257, 258, 330/261

[56] References Cited

U.S. PATENT DOCUMENTS 3,649,926  3/1972  Hill ................................... 330/261 X
3,828,268  8/1974  Nishio .................................. 330/252
4,059,808  11/1977 Sakamoto et al. ............... 330/261 X

OTHER PUBLICATIONS

D.A.T.A. Linear Integrated Circuit, 20th Edition, 1979, pp. 173 and 221.
National Semiconductor Linear Databook (1978), LM101 Operational Amplifier, pp. 3-60 & 3-65.

Primary Examiner—James B. Mullins
Attorney, Agent, or Firm—E. M. Whitacre; J. S. Tripoli; E. P. Herrmann

[57] ABSTRACT

A differential amplifier stage is disclosed which utilizes opposed pairs of complementary transistors. The emitter electrodes of the complementary transistors of each pair are connected via matched resistors. A second matched pair of resistors are connected between the emitter electrodes of the input transistor of each complementary transistor pair. The interconnection of the second match pairs of resistors is connected to the base electrodes of the other transistors of each complementary transistor pair by a diode. A constant bias current is applied to the diode-transistor interconnection to provide current to the second pair of resistors to develop like potentials. These potentials establish floating bias potentials across the matched resistors in the emitter circuits of the complementary transistor pairs and thereby establish bias current in the transistors.

5 Claims, 2 Drawing Figures

OPERATIONAL AMPLIFIER

This invention relates to differential amplifier circuits and more particularly to a differential input stage utilizing opposed pairs of complementary transistors.

The parallel configuration of series connected complementary NPN and PNP transistors sharing common bias currents has been found advantageous for use with differential operational amplifiers due to their desirable characteristics of low offset voltage, low offset current, low input current, low thermal drift and immunity to supply voltage variations. In such complementary configurations, the input variations of one active device are cancelled by the matched equivalent to give offset and temperature characteristics dependent only on the degree to which the devices are matched. It has, however, been necessary in previously developed complementary transistor differential amplifiers to provide somewhat complicated and expensive biasing circuitry therefor.

For instance, one type of biasing technique heretofore employed, utilized a feedback loop to vary the bias voltage level applied to the bases of PNP-type transistors connected in the differential configuration. An example of this previously developed biasing technique is incorporated in the circuit known as the μA741 Operational Amplifier manufactured and sold by the Fairchild Semiconductor Corporation. Other types of bias networks have also been developed wherein the bias voltage applied to the differential connected complementary transistor circuit is dependent upon the varying $h_{FE}$ of the differentially connected PNP transistors. An example of such a circuit is the LM101 Operational Amplifier manufactured and sold by the National Semiconductor Corporation. The biasing networks of both of these circuits tend to permit signal feedback which can undesirably affect the frequency and common mode response of the amplifier.

A third type of biasing network is described in U.S. Pat. No. 3,649,926. This biasing circuit for the complementary transistor differential stage includes a transistor connected in series with one of the pairs of complementary transistors. The transistor has a base whch is coupled to the other pair of complementary transistors. A generally constant current source is connected to establish a predetermined current flow through one pair of the complementary transistors. Variations in the input voltage applied across the opposed pairs of the complementary transistors is then reflected in the output of the transistor. Unfortunately the assymmetry of this stage tends to result in assymmetrical signal gain at high frequencies depending upon the input terminal to which signal is applied.

In accordance with the present invention a differential amplifier stage is provided having a symmetrical circuit configuration to produce symmetrical gain frequency characteristics and without a signal feedback path in the bias network which ordinarily tends to degrade common mode performance and produce circuit instabilitites for high frequency operation.

An object of the present invention is to provide a differential amplifier stage having gain which is substantially independent of bias current.

Another object of the present invention is to provide a differential amplifier for integrated circuit manufacture that is substantially insensitive to thermal gradients generated within the integrated circuit substrate material.

SUMMARY OF THE INVENTION

A first PNP transistor has its collector electrode connected to the input terminal of a current mirroring circuit and a second matched PNP transistor has its collector electrode connected to the output terminal of the current mirror circuit from which output signal is available. The base electrodes of the first and second PNP transistors are interconnected at a first node to which bias current is supplied. The emitter electrodes of the first and second PNP transistors are respectively connected to the emitter electrodes of first and second matched NPN transistors via matched first and second resistors. The emitter electrodes of the first and second NPN transistors are respectively connected to a second node via third and fourth matched resistors and a diode poled for forward conduction of said bias current is connected between the first and second nodes.

The collector electrodes of the first and second NPN transistors are connected to a source of positive supply potential. The base electrodes of these same transistors are arranged for application of differential input voltage signals.

The diode and third resistor is effectively in parallel connection with the first resistor and base-emitter junction of the first PNP transistor. The didoe and fourth resistor is effectively in parallel with the second resistor and base-emitter junction of the second PNP transistor. Potentials developed by like proportion of the constant bias current being conducted by the third and fourth resistors, establish like potentials for biasing the base-emitter circuits of the PNP transistors. These bias potentials float with respect to common mode voltages applied to the amplifier input terminals to provide the amplifier with common mode rejection.

DETAILED DESCRIPTION OF THE INVENTION

Figures 1, 2:
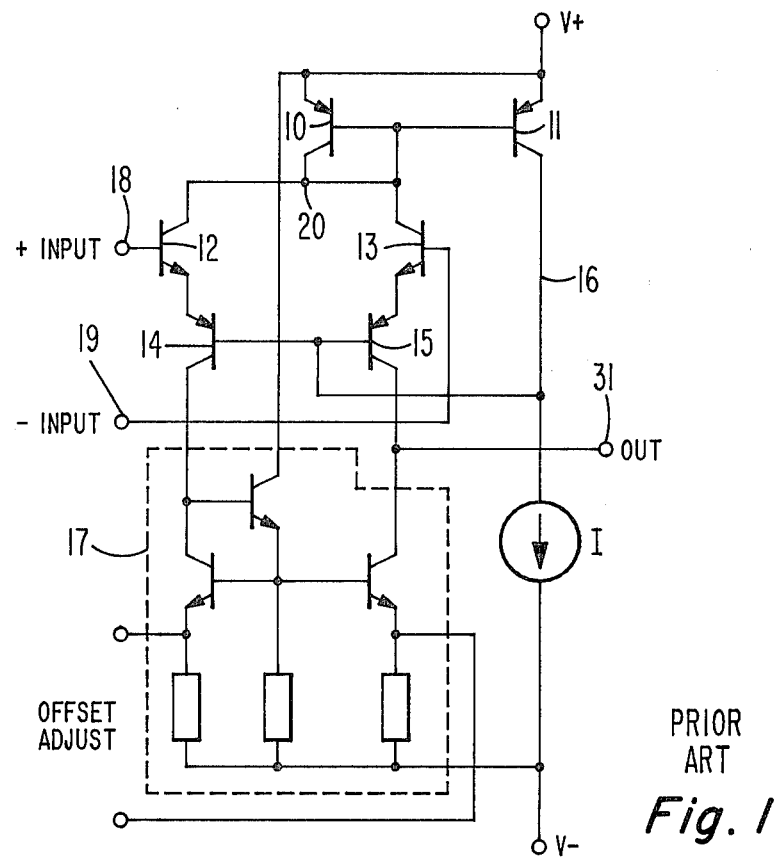
FIG. 1 is a schematic diagram of a differential amplifier input stage utilizing complementary transistor pairs which is commonly employed in Operational Amplifiers.
FIG. 2 is a schematic diagram of a differential amplifier input stage embodying the present invention.

In FIG. 1 first and second common collector transistor amplifiers 12 and 13 are direct current connected to first and second common base transistor amplifiers 4 and 15. Output signals from the amplifiers 14 and 15 are applied to a differential to single ended converter comprising the current mirror 17 and having an output terminal at 31. Differential input signals are applied to terminals 18 and 19.

Bias current is supplied to the base electrodes of the common base amplifiers 14 and 15 by the combination of the constant current source I and the variable current source 11. Current supplied by variable source 11 is in proportion to the current being conducted in the parallel amplifiers comprising the series connected amplifiers 12 and 14 and the series connected amplifiers 13 and 15. Transistor 10 having its collector and base electrodes connected to the common collector connection 20 is arranged as the input (master) transistor of a current mirror and transistor 11 having its base and emitter electrodes respectively connected to the base and emitter electrodes of transistor 10 reflects a portion of the current conducted therein. By virtue of this arrangement common mode input potentials which tend to cause changes in current flow in the collector emitter circuits of transistors 12 and 13, increase/decrease the current supplied by transistor 11 and thereby the potential at the base connection of transistors 14 and 15. The change in base potential of transistors 14 and 15 is translated across their respective base-emitter junctions to bias transistors 12 and 13 in a direction tending to reduce the current and provide common mode rejection. As the frequency of the input common mode signal increases, however, the common mode rejection decreases due to inherent delays in the circuit.

One of the particular advantages of the FIG. 1 circuit is its relative thermal stability due to thermally induced parametric changes in the base-emitter junction of the NPN transistors 12 and 13 being compensated by substantially complementary parametric changes in the base-emitter junctions of PNP transistors 14 and 15. However, the parameter compensation only holds for uniform thermal changes occurring over all four transistors. If a thermal gradient exists across the devices, then incomplete compensation results with a concomitant offset appearing at output node 31. This s a common occurrence where the circuit is realized on a single silicon die which includes subsequent power output stages. This problem is obviated by the bias current in the present invention embodied in FIG. 2.

In FIG. 2 a differential voltage input amplifier stage 100 has differential voltage input terminals 50 and 51 and a single ended output terminal 65. A single ended power amplifier 101 is connected in cascade with the input stage thereof connected to terminal 65. The cascaded amplifier combination is powered by relatively positive, $V_P$, and relatively negative, $V_N$, supply potentials.

A first PNP transistor 62 has its collector electrode 64 connected to the input terminal of a current mirror circuit 66 and a second matched PNP transistor 63 has its collector electrode connected to the output terminal of the current mirror 66. An output signal is available from the collector of transistor 63 at terminal 65. The base electrodes of PNP transistors 62 and 63 are interconnected at node 61 to which a constant bias current I is applied by constant current source 70.

First and second matched NPN transistors 52 and 53 have their base electrodes connected to the input terminals 51 and 50 respectively and their collector electrodes directly interconnected to the positive supply potential $V_P$ at connection 54. The emitter electrode of NPN transistor 52 is connected to the emitter electrode of PNP transistor 62 by a first resistor 59. Similarly the emitter electrodes of NPN, 53, and PNP 63 transistors are connected via a second resistor 60 which is arranged to have substantially the same value as resistor 59, i.e., the two resistors are matched. Third and fourth matched resistors 56 and 57 are serially connected between the emitter electrodes of NPN transistors 52 and 53. A diode 58 which may be a transistor with its base and collector electrodes interconnected is connected between the interconnection 55 of resistors 56 and 57 and node 61 and is poled to conduct current in the forward direction from the resistors 56 and 57 to the current source 70. If the circuit is realized in integrated circuit form, then transistors 52 and 53 can be located in close proximity to each other, and, if possible, interdigitated. Similarly transistors 62 and 63 should be proximate one another and possibly interdigitated. The four resistors have relatively high resistance values, e.g., 10K ohm and thus each will have a relatively large geometric length to width ratio in integrated form. Resistors 56 and 57 should be arranged proximate to and parallel with respect to the long dimension and formed in a serpentine configuration so that thermal gradients occurring in the silicon die will affect both resistors similarly. Resistors 59 and 60 should be arranged in similar fashion.

For descriptive purposes consider that the base currents to transistors 62 and 63 to be negligible. Consider also that equal potentials are applied to terminals 50 and 51, that diode 58 is scaled so that in the quiescent condition the forward potential drop thereacross equals the base-emitter junction potential of transistors 62 and 63 and that the resistance values of resistors 56, 57, 59 and 60 are equal.

The current supplied by source 70 passes in diode 58 developing a forward potential thereacross and then splits equally between resistors 56 and 57. Summing potentials in the loop 01 it can be demonstrated that the current conducted in resistor 59 equals the current conducted in resistor 56 and equals I/2. Similarly the current conducted in resistor 60 is I/2. The emitter current conducted in NPN transistor 52 is the sum of the currents conducted in resistors 59 and 56 and equals I. Similarly the emitter current conducted by NPN transistor 53 is equal to I. From the foregoing it is seen that the bias condition of the amplifier is established by selection of the current I supplied by current source 70. It should be appreciated that the current conducted in transistors 52 and 53 and thereby transistors 62 and 63 is independent of the common mode voltage at terminals 50 and 51 and therefore the stage exhibits a high common mode rejection. To illustrate this point further consider a common mode potential change $\Delta V$ at terminals 50 and 51. This voltage is translated by emitter follower action to the emitter electrodes of transistors 52 and 53. The potential drop across resistors 56 and 57 is developed solely due to the source 70 currents I/2 conducted therein so that the potential $\Delta V$ is translated to the interconnection 55. Diode 58 being forward biased behaves as a voltage offset and translates the voltage $\Delta V$ to the base electrodes of transistors 52 and 63. The potential $\Delta V$ is thereafter translated to the emitter electrodes of transistors 62 and 63 via emitter follower operation resulting in the potential $\Delta V$ being present at both ends of the respective resistors 59 and 60. The common mode change $\Delta V$ will induce no current change in resistors 59 and 60 and therefore no current change in the collector circuits of transistors 62 and 63.

On the other hand a differential change $\Delta V$ and $(-)\Delta V$ applied to terminals 50 and 51 generates differential signal current in the emitter circuits of PNP transistors 62 and 63 in the following manner. The emitter follower operation of transistors 52 and 53 translate the differential signals $(-)\Delta V$ and $\Delta V$ to their respective emitter connections. The potentials $(-)\Delta V$ and $\Delta V$ impressed across the series connection of resistors 57 and 56 produce a zero potential change at their interconnection 55. However, a potential change $-\Delta V$ appears across resistor 57 and a potential change $\Delta V$ appears across resistor 56. These potentials are respectively impressed across resistors 60 and 59 to produce current changes $\Delta I$ therein equal to $\Delta V/R$ where R is the resistance of resistors 59 and 60. The signal currents $\Delta I$ and $-\Delta I$ are reflected in the collector circuits of transistor 63 and 62 to produce an output voltage at terminal 65 equal to $2\Delta IR_O$ where $R_O$ is the resistance of the parallel output impendance of transistor 63 and the output resistance of current mirror 66. The differential stage gain is given approximately by $R_O/R$ provided of course that the input impedance to amplifier A101 is large compared to the parallel output impedance of transistor 63 and current mirror 66.

Refer again to FIG. 1 and consider a thermal gradient which produces a change $\Delta V_{BE}$ in the base-emitter bias potential of transistor 14. This potential change will generate a current offset $\Delta I_S$ in the collector current of transistor 14 proportional to $\Delta V_{BE}/R_E$ where $R_E$ is the resistance seen looking into the emitter of transistor 12 and will typically be relatively small. The offset current $\Delta I_S$ will therefore be relatively large. Consider a like potential change $\Delta V_{BE}$ in the base-emitter bias potential of transistor 62 (FIG. 2). The offset current $\Delta I_S$ generated in this circuit is proportional to $\Delta V_{BE}/R59$ where R59 is the resistance of resistor 59 which is relatively large. Thus $\Delta I_S$ will be relatively small.

Next consider a thermal gradient which produces a base-emitter potential offset in one of transistors 12 or 13 (FIG. 1). This potential offset will generate a current offset $\Delta I_S$ in the collector circuits of transistors 14 or 15 respectively proportional to $\Delta V_{BE}/R_{EP}$ where $R_{EP}$ is the resistance seen looking into the emitter electrode of PNP transistor 14(15). A similar base-emitter offset potential $\Delta V_{BE}$ generated in one of the transistors 52 or 53 (FIG. 2) will generate an offset current $\Delta I_S$ in the collector circuit of transistor 62 proportional to $\Delta V_{BE}/R59$. The value of R59 will typically be larger than the value of $R_{EP}$ so that the offset current generated in the FIG. 2 circuit is less than that generated by an equal offset potential in FIG. 1.

Offset currents resulting from $V_{BE}$ changes in the base-emitter junction of the PNP transistors due to thermal gradients may be further reduced by careful design. The diode 58 when realized by means of a PNP transistor with collector and base electrodes interconnected will exhibit a forward offset potential drop responsive to thermal changes similar to transistors 62 and 63. By sandwiching such a diode between transistors 62 and 63 (in an integrated circuit) to insure the three devices will be evenly subjected to thermal gradients likely to occur, potential offsets occurring in the PNP devices will of necessity be impressed at the emitter electrodes of transistors 62 and 63 and also at node 55. The effective biasing potentials across transistors 59 and 60 will remain substantially constant precluding changes in the emitter currents and thereby the collector currents of transistors 62 and 63.

The inclusion of the resistors 56, 57, 59 and 60 tend to increase the stability of the circuit with respect to thermal gradients therein. Further, the bias arrangement provides bias currents without the inclusion of feedback paths which tend to limit common mode frequency response. Finally the bias point is established by selection of a single bias current source (which may be realized with an electronically variable current source).

While the illustrative embodiment of FIG. 2 is drawn with bipolar devices it should be appreciated that field effect transistors may be substituted therefore. The pairs of matched resistors 56, 57 and 59, 60 may be selected to have like resistance values or the resistor pairs may be selected to have differing values. Finally, in order to realize maximum gain at the output terminal 65 the load means connected to the collector electrodes of PNP transistors 62 and 63 will advantageously be selected to be a double to single ended circuit such as current mirror 66 or a circuit performing a similar function. However, independent load means may be connected to the respective collector electrodes in which case either a single ended or differential output signal may be made available.

What is claimed is:

1. A differential amplifier comprising:
    means for applying supply potential;
    first and second input terminals and an output terminal;
    a bias current source;
    first and second transistors of a first conductivity type, each having respective first and second electrodes and a principal conduction path therebetween, and respective control electrodes, the principal conduction paths being controlled by potential applied between the respective control and first electrode;
    respective means for connecting the second electrodes of said first and second transistor to the means for applying supply potential and for connecting the respective control electrodes to the first and second input terminals respectively;
    third and fourth transistors of a conductivity type complementary to said first type each having respective first and second electrodes and a principal conduction path therebetween, respective control electrodes, and potential applied between the control and first electrodes controlling the respective principal conduction paths;
    means for connecting the control electrodes of the third and fourth transistors to said bias current source;
    load means connected to the second electrodes of the third and fourth transistors and means for connecting the second electrode of the fourth transistor to said output terminal;
    first and second matched resistive means for respectively connecting the first electrodes of the first and third transistors, and for connecting the first electrodes of the second and fourth transistors;
    third and fourth matched resistive means serially connected, without intervening elements, between the first electrodes of the first and second transistors;
    and
    a single potential offset means connected between the interconnection of said third and fourth resistive means and the control electrodes of said third and fourth transistors.

2. The differential amplifier set forth in claim 1 wherein the potential offset means comprises a diode poled to conduct current from said bias current source in the forward direction.

3. The differential amplifier set forth in claim 1 wherein the potential offset means comprises a transistor of the same conductivity type as said third and fourth transistors having a first electrode connected to the interconnection of the third and fourth resistive means and a control and second electrode connected to the control electrodes of the third and fourth transistors.

4. The differential amplifier set forth in claims 1, 2, or 3 wherein said load means comprises a current mirror means having an input terminal connected to the second electrode of the third transistor and an output terminal connected to the second electrode of the fourth transistor.

5. The differential amplifier set forth in claim 4 wherein the first, second, third and fourth transistors comprise bipolar devices.

* * * * *